(12) United States Patent
Pettmann

(10) Patent No.: US 10,544,910 B2
(45) Date of Patent: Jan. 28, 2020

(54) LIGHTING DEVICE WITH LED FILAMENTS

(71) Applicant: LED-NER, Carnoux en Provence (FR)

(72) Inventor: Marc Pettmann, Carnoux en Provence (FR)

(73) Assignee: LED-NER, Carnoux en Provence (FR)

( * ) Notice: Subject to any disclaimer, the term of this patent is extended or adjusted under 35 U.S.C. 154(b) by 193 days.

(21) Appl. No.: 15/728,565

(22) Filed: Oct. 10, 2017

(65) Prior Publication Data

US 2018/0031185 A1 Feb. 1, 2018

Related U.S. Application Data

(63) Continuation of application No. PCT/FR2016/050732, filed on Mar. 31, 2016.

(30) Foreign Application Priority Data

Apr. 8, 2015 (FR) ...................................... 15 53011

(51) Int. Cl.
*F21K 9/272* (2016.01)
*F21K 9/275* (2016.01)
(Continued)

(52) U.S. Cl.
CPC .............. *F21K 9/272* (2016.08); *F21K 9/275* (2016.08); *F21K 9/68* (2016.08); *F21V 19/0025* (2013.01);
(Continued)

(58) Field of Classification Search
CPC . F21K 9/27; F21K 9/272; F21K 9/275; F21K 9/68; F21S 4/20; F21S 4/26;
(Continued)

(56) References Cited

U.S. PATENT DOCUMENTS 5,697,695 A * 12/1997 Lin .......................... F21L 4/02
362/184
9,574,755 B1 * 2/2017 Gutierrez .............. F21V 21/005
(Continued)

FOREIGN PATENT DOCUMENTS

| CN | 104110632 | 10/2014 |
| CN | 204099964 | 1/2015 |

(Continued)

OTHER PUBLICATIONS

International Search Report for International Application PCT/FR2016/050732, dated Jun. 20, 2016.

*Primary Examiner* — Zheng Song
(74) *Attorney, Agent, or Firm* — Burris Law, PLLC

(57) ABSTRACT

A lighting device is providing that includes several LED filaments disposed inside a partially transparent external container and connected to anode and cathode output terminals. Each LED filament includes a slimline substrate, a plurality of light-emitting diodes regularly distributed in line. The diodes are sequentially connected in series. Each LED filament further includes an envelope overmoulded around the diodes and the substrate, and two electrodes forming the anode and the cathode of the LED filament protruding from the envelope. The electrodes fixed to two opposite ends of the substrate and connected electrically to the first and last diodes. The external container forms a hollow and slimline component with two opposite ends, and the LED filaments laid out to at least one lighting line where each lighting line includes several LED filaments aligned sequentially and anodes and cathodes are connected to their respective output terminals.

23 Claims, 8 Drawing Sheets

(51) Int. Cl.
*F21K 9/68* (2016.01)
*F21V 19/00* (2006.01)
*F21V 21/005* (2006.01)
*F21V 23/00* (2015.01)
*F21Y 103/10* (2016.01)
*F21Y 115/10* (2016.01)

(52) U.S. Cl.
CPC .......... *F21V 21/005* (2013.01); *F21V 23/002* (2013.01); *F21Y 2103/10* (2016.08); *F21Y 2115/10* (2016.08)

(58) Field of Classification Search
CPC ...... F21S 4/28; F21V 19/0025; F21V 21/005; F21V 23/002; F21Y 2103/10; H01L 25/0753; H01L 25/0756
See application file for complete search history.

(56) References Cited

U.S. PATENT DOCUMENTS

| | | | | |
|---|---|---|---|---|
| 2004/0007980 | A1* | 1/2004 | Shibata | F21K 9/27 313/634 |
| 2006/0158883 | A1* | 7/2006 | Wu | F21V 23/00 362/249.16 |
| 2007/0274067 | A1* | 11/2007 | Sloan | F21V 15/015 362/219 |
| 2009/0213573 | A1* | 8/2009 | Furukawa | F21K 9/00 362/97.1 |
| 2011/0273863 | A1 | 11/2011 | Cai et al. | |
| 2013/0058080 | A1* | 3/2013 | Ge | F21V 3/00 362/231 |
| 2013/0141892 | A1 | 6/2013 | Okazaki et al. | |
| 2013/0170197 | A1* | 7/2013 | Bishop | F21V 21/00 362/222 |
| 2014/0036505 | A1* | 2/2014 | Barton | F21V 21/005 362/249.06 |
| 2014/0369036 | A1 | 12/2014 | Feng | |
| 2014/0375201 | A1 | 12/2014 | Su et al. | |
| 2015/0377428 | A1* | 12/2015 | Chen | F21V 29/502 362/84 |

FOREIGN PATENT DOCUMENTS

| | | |
|---|---|---|
| CN | 104377194 | 2/2015 |
| CN | 104406068 | 3/2015 |
| CN | 204201571 U | 3/2015 |
| EP | 2434201 | 3/2012 |

* cited by examiner

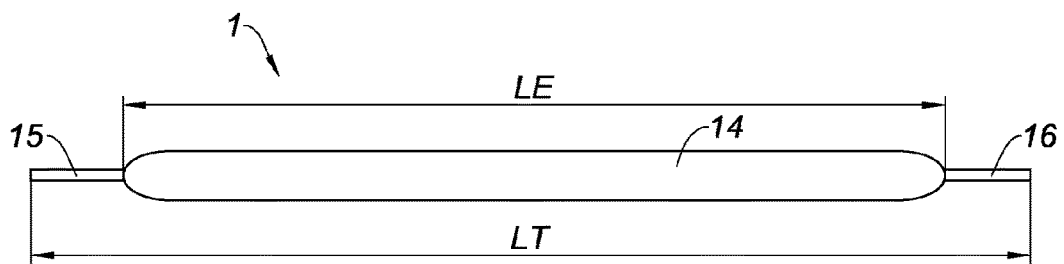
Fig. 1 PRIOR ART
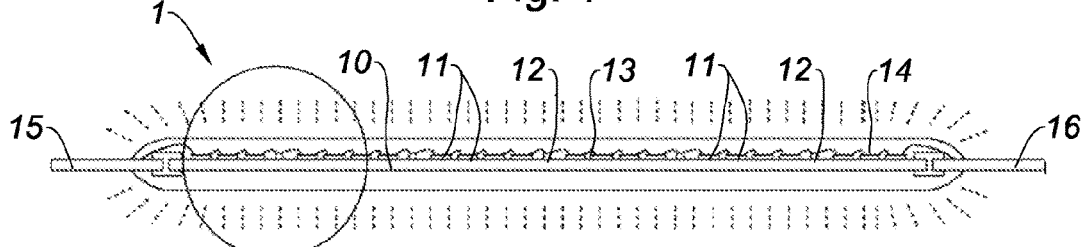
Fig. 2 PRIOR ART
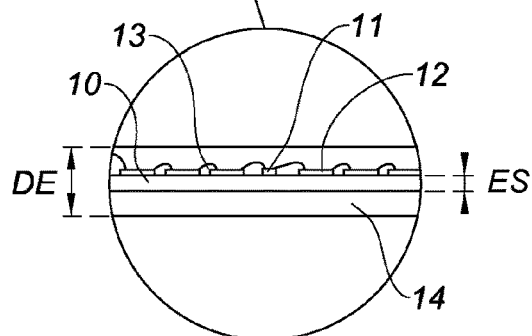
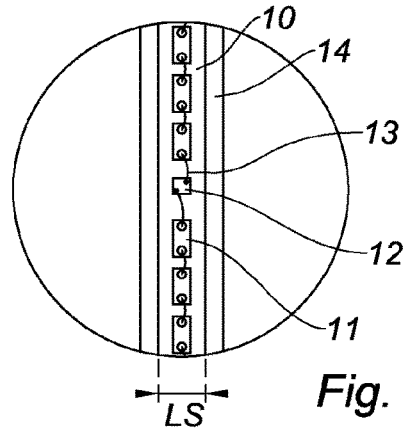
Fig. 3
PRIOR ART
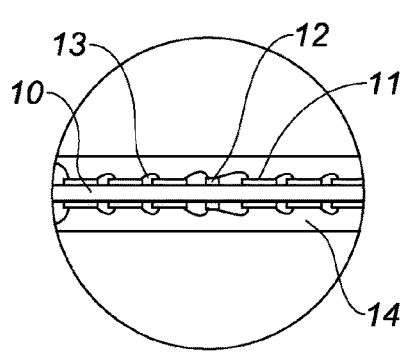
Fig. 4
PRIOR ART

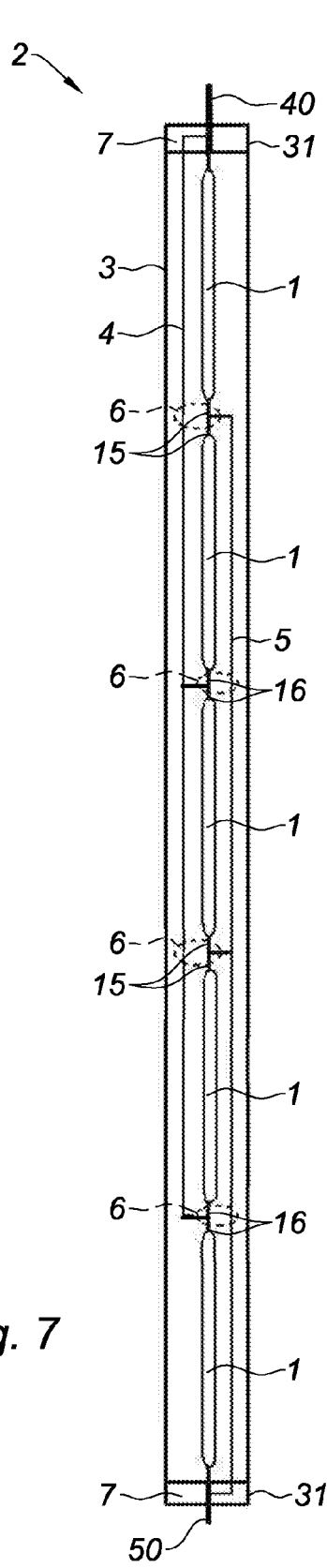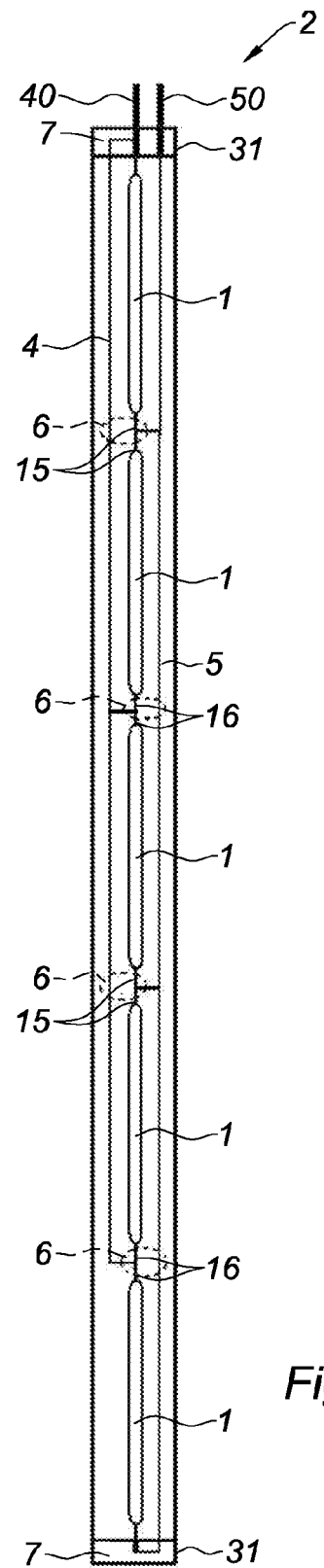
Fig. 7
Fig. 8

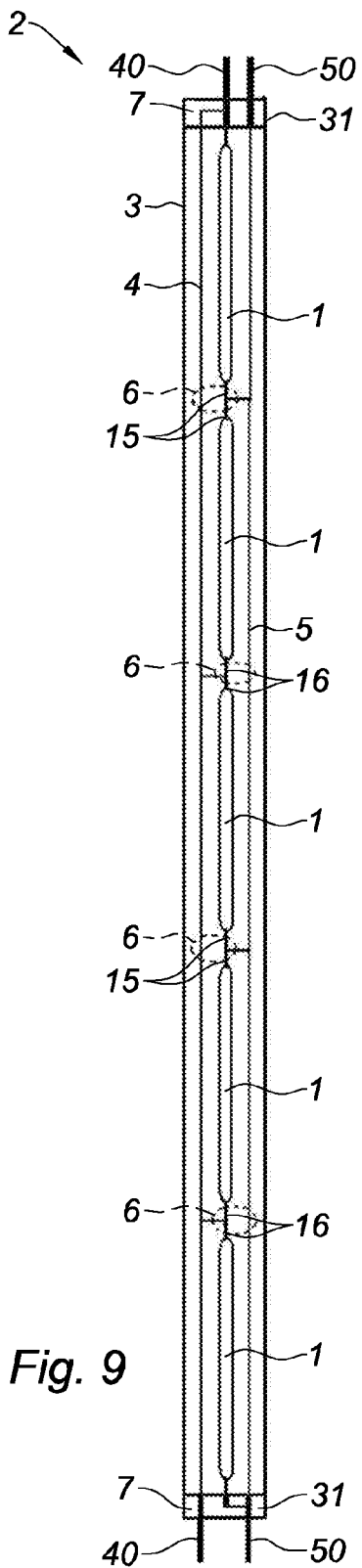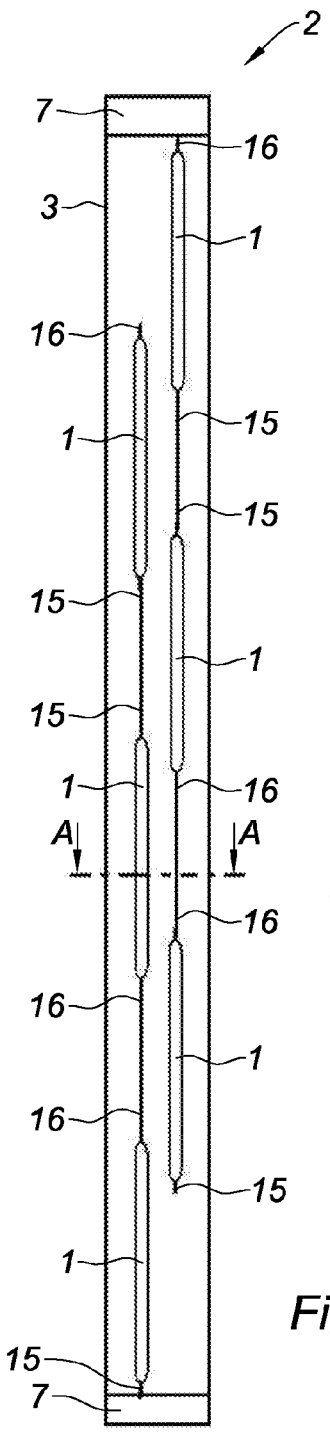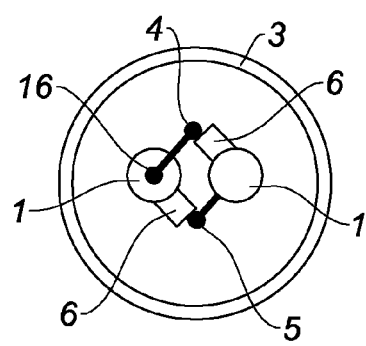
Fig. 9
Fig. 10
Fig. 11

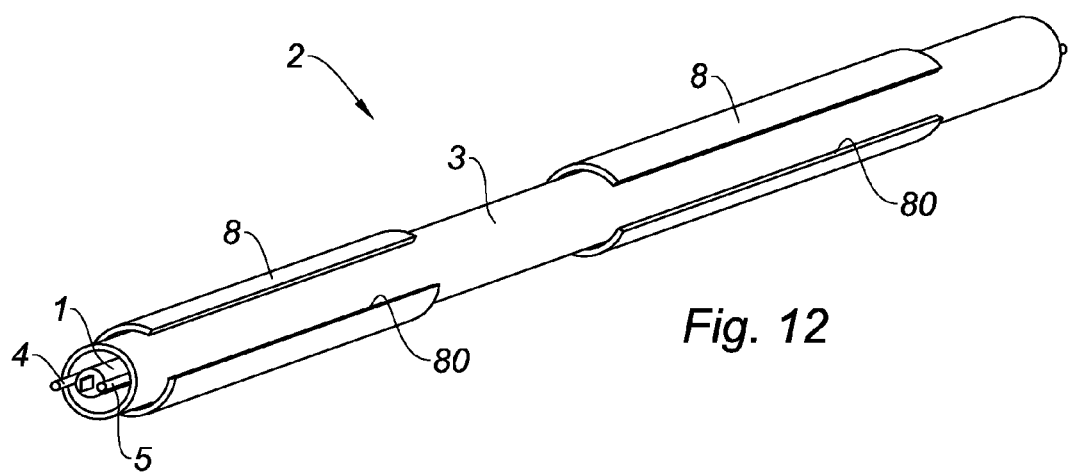
Fig. 12
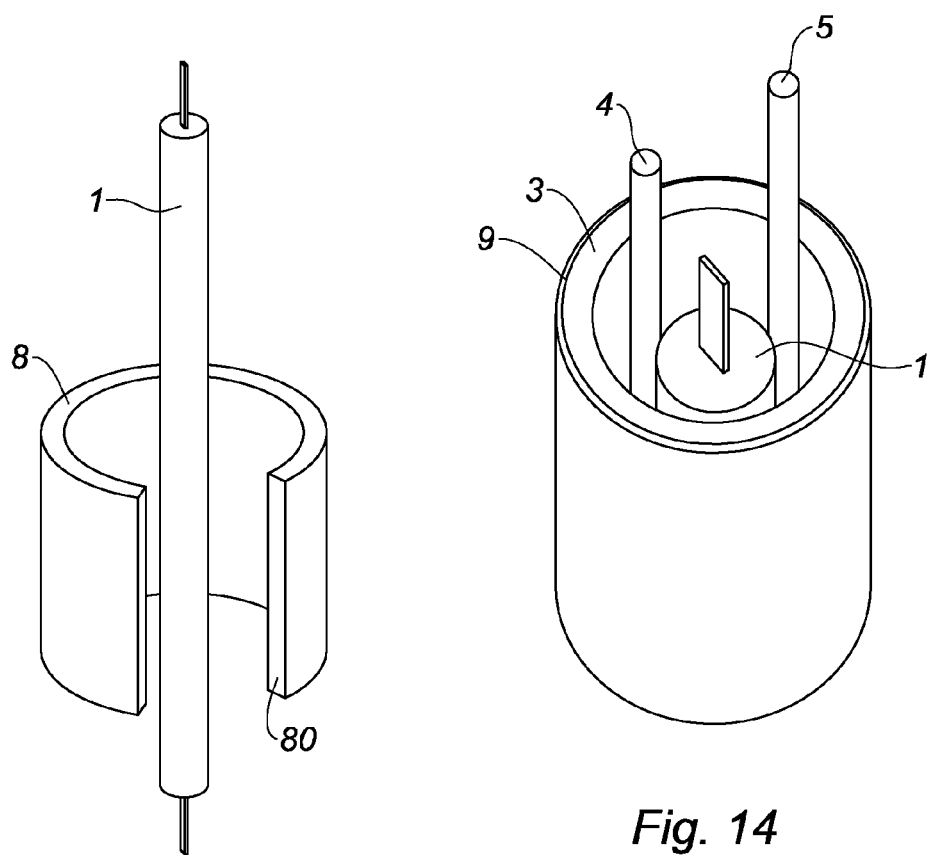
Fig. 13
Fig. 14

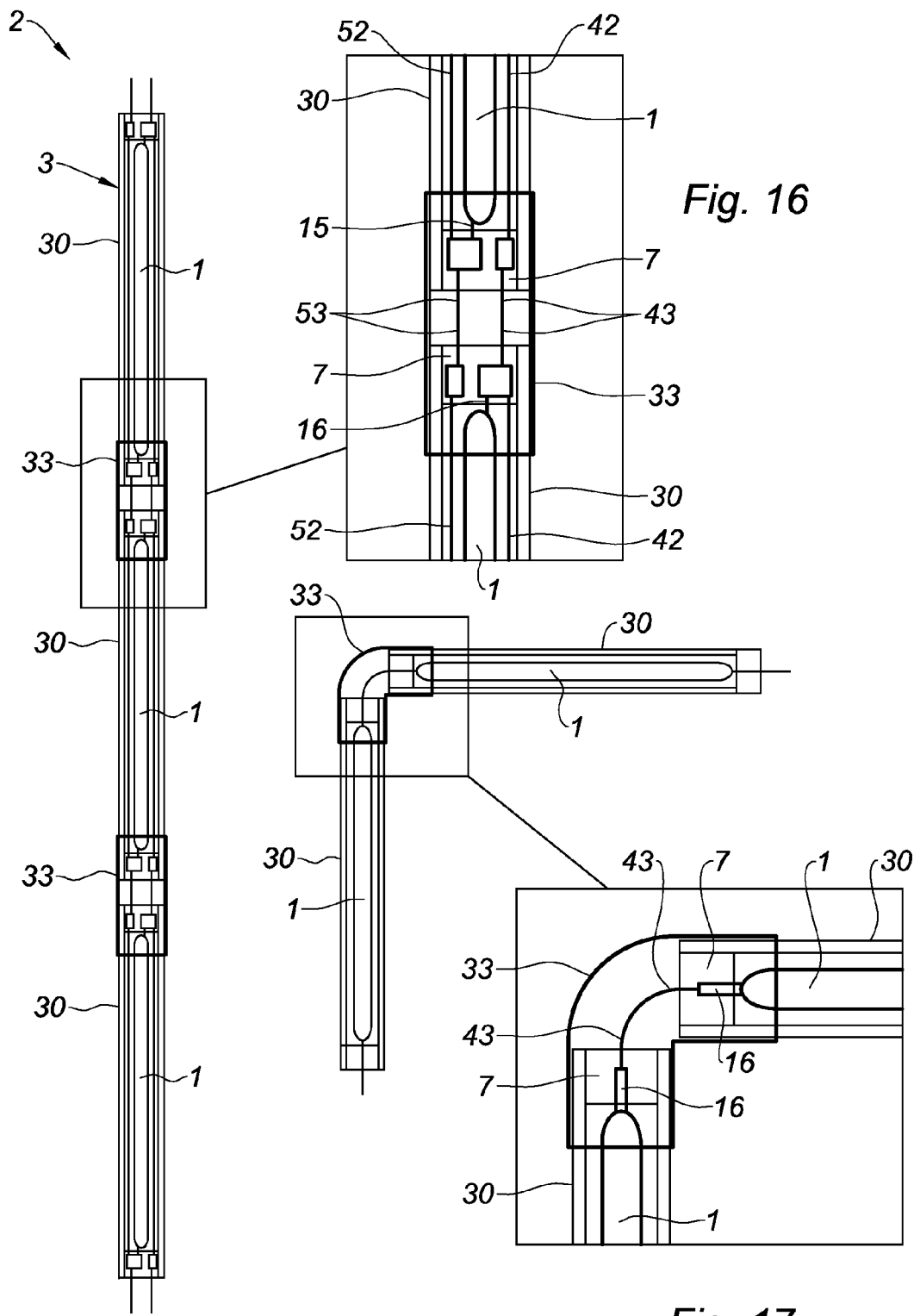

LIGHTING DEVICE WITH LED FILAMENTS

CROSS-REFERENCE TO RELATED APPLICATIONS

This application is a continuation of International Application No. PCT/FR2016/050732, filed on Mar. 31, 2016, which claims priority to and the benefit of FR 15/53011 filed on Apr. 8, 2015. The disclosures of the above applications are incorporated herein by reference.

FIELD

The present disclosure relates to a lighting device, and more specifically to a lighting device including light sources of the LED filament type.

BACKGROUND

The statements in this section merely provide background information related to the present disclosure and may not constitute prior art.

In different lighting fields, and more particularly in that of lighting shop window and shelves, it is important to provide a very high-quality lighting, which results in a high CRI index (color rendering index), that is to say at least greater than 90.

LED filaments are disclosed in United States Published Application No. US 2014/0369036 A1 filed by the Company Shenzen Runlite Technology Co., Ltd. These LED filaments are also marketed by this same Company under the reference "LED FILAMENT", and particularly under the product codes FSS1-JG-CEEF-D0, FSS1-JG-NBFF-D0, FSS1-JG-WJDF-D0, FSS1-JG-WIDF-D0, FSQ1-JG-CEAF-D0, FSQ1-JG-WIAF-D0 and FSQ1-JG-WELJ-D0.

With reference to FIGS. 1 to 4, a LED filament 1 comprises a substrate 10 in the form of an elongate flat bar or rod, a plurality of blue 11 and red 12 light-emitting diodes 12 regularly distributed in line on the substrate 10, these diodes 11, 12 being connected successively in sequence and in series by means of electrical wires 13. The LED filament further comprises an envelope 14 overmolded around the diodes 11, 12 and the substrate 10. The two opposite ends of the substrate are provided with two metal electrodes 15, 16 forming respectively the anode and the cathode of the LED filament 1, the electrodes 15, 16 being fastened on the substrate 10, in the extension of said substrate, and being electrically connected respectively to the first and last diodes placed on the substrate 10 by means of corresponding electrical wires. The electrodes 15, 16 projecting from the envelope 14.

As shown in FIG. 2, the diodes 11, 12 may be distributed only on a lateral face of the substrate 10. Alternatively, and as shown in FIG. 4, the diodes 11, 12 may be distributed along two lines on the two opposite lateral faces of the substrate 10.

The substrate 10 is, for example, made of a material transparent to the radiation of the diodes 11, 12, to promote a 360°-lighting around the envelope 14, such as a ceramic or plastic material.

The envelope 14, placed over the entire periphery of the substrate 10, forms a protective layer which is made of a transparent colloidal gel or material containing fluorescent particles, and in particular phosphorus particles.

The overall length LT of the LED filament 1 is conventionally comprised between 10 and 150 millimeters, the substrate 10 has a width LS comprised between 0.5 and 2 millimeters and a thickness ES comprised between 0.1 and 1 millimeters, the envelope 14 has a cross-section substantially circular along a diameter DE comprised between 1 and 5 millimeters. It is known, in particular from the documents CN104406068, CN104377194 and CN204201571, to use such LED filaments inside a single-ended light bulb, as a replacement for an incandescent filament. To this end, the LED filaments are disposed side by side inside the bulb of the lightbulb, and connected respectively to the cap and to the central base of the lightbulb.

However, this use of LED filaments has several drawbacks, the first of which is that the bulbs are generally large-sized and have fixed geometrical and dimensional features, limiting their integrations in shop windows and shelves due to an excessive bulk. Furthermore, these LED filament lightbulbs are not sealed, and their sealing is often very complex or even not achievable.

It is further known from United States Patent Publication No. US 2014/375,201 to arrange, within a bulb of lightbulb, a LED filament inside a transparent heat convection tube, or even to arrange several LED filaments connected in series and surrounded by respective tubes which are brought closer at their ends. This arrangement is probably adapted for a lightbulb, but is completely unsuitable to make a miniature and adjustable linear lighting device.

United States Patent Publication No. US 2013/141,892 proposes to connect several LED filaments in series and to arrange them inside a transparent tube. However, this connection in series is unsuitable for a stable and long-lasting operation, in particular in case of failure of a diode within a LED filament.

SUMMARY

The present disclosure provides a lighting device with LED filaments which has a reduced bulk, and in particular a miniature and adjustable linear lighting device.

To this end, the present disclosure provides a lighting device comprising several LED filaments arranged inside an outer container at least partially transparent and connected to anode and cathode output terminals arranged outside the outer container, each LED filament comprising a longilineal substrate, a plurality of light-emitting diodes regularly distributed in line on the substrate, said diodes being connected successively in sequence and in series, an envelope overmolded around the diodes, and the substrate, and two metal electrodes forming respectively the anode and the cathode of the LED filament projecting from said envelope, said electrodes being fastened respectively to the two opposite ends of the substrate and being electrically connected respectively to the first and last diodes placed on the substrate, said lighting device being noteworthy in that said outer container forms a hollow and longilineal part provided with two opposite ends, and in that the LED filaments are distributed along at least one lighting line, in which the or each lighting line comprises several LED filaments disposed in successive alignment and connected in parallel such that their anodes are connected to the anode output terminal and their cathodes are connected to the cathode output terminal.

Thus, the present disclosure provides the use of LED filaments, such as the LED filaments disclosed in United States Patent Publication No. US 2014/0369036 A1, by aligning them inside a longilineal container, thus offering a particularly limited bulk. Indeed, by taking advantage of the longilineal shape of the LED filaments and the particularly small thicknesses/diameters thereof (less than 5 millimeters, or even less than 2 millimeters), the present disclosure allows obtaining 360°-lighting, while offering the possibility of proposing linear lighting devices and of the desired length.

Optionally, each LED filament may comprise a plurality of blue and red light-emitting diodes regularly distributed, and the envelope is made of a transparent colloidal gel or material containing fluorescent particles, and in particular phosphorus particles.

According to a possibility of the present disclosure, the lighting device further comprises at least one opaque reflector, having a reflective inner surface, arranged on a circumference of the outer container and having a longitudinal slot provided for the passage of the light emitted by the LED filaments.

Such a reflector allows passing, via its longitudinal slot, a portion of the luminous flux, the width of the longitudinal slot is adapted according to the directivity or the desired lighting emission angle.

It is of course possible to provide one or more reflector(s) on the outer container, more or less long and more or less close. With the use of several reflectors, it is possible, due to the independent orientation of the reflectors, to focus different areas of the lighted space.

The reflective inner surface may be a neutral white inner surface or a white inner surface pigmented of at least one color.

According to a feature, the or each reflector has an arc-shaped cross-section, whose center is substantially located on a lighting line, such that it forms, in the lighting situation, a resonant cavity which returns multiple times the lighting flux into the envelope of at least one LED filament.

In the LED filaments, it is desired to use an envelope composed of a gel containing fluorescent particles, and in particular phosphorus particles.

As a reminder, the LED filaments comprise blue light-emitting diodes. However, only one portion of the blue emission of the LED filaments is absorbed by the fluorescent particles, so that at least two emissions are superimposed at the output of the LED filament.

The applicant has observed that, when such an arc-shaped reflector centered on the LED filaments and having a reflective inner coating is positioned around a LED filament, the reflector returns the entire spectrum emitted by the LED filament through the envelope of the LED filament which will be excited again by the blue rays. Thus, the output light becomes less white, and so on reflection after reflection.

In other words, the reflector forms a resonant cavity which returns into the envelope of at least one LED filament multiple times the effective flux (blue spectrum) emitted through it. Therefore, the efficiency of the fluorescent particles is artificially increased by limiting the blue spectral energy coming out of the longitudinal slot of the reflector. The unexpected induced effect is therefore a warming of the emitted light, a uniformization of the colorimetry and a very effective filtering of the blue radiation.

According to the reflective inner coating of the reflector, different resulting color temperatures are obtained. Thus, by associating several more or less white reflectors, it is possible to influence the different resulting color temperatures per area with the same lighting device.

According to another feature, the or each reflector extends over an angle sector at least greater than 200°.

With such an angle sector, the resonance effect observed above is amplified. By way of example, the or each reflector extends over an angle sector comprised between 240 and 330°, thus offering an opening angle of the slot comprised between 30 and 120°.

However, it is of course possible that the or each reflector extends over an angle sector less than 200°, or even less than 180°.

In one form of the reflector, the reflector is in the form of a reflective member mounted around the outer container, that is to say on an outer circumference of the outer container, or mounted inside the outer container, that is to say on an inner circumference of the outer container.

When the reflective member is mounted around the outer container, it may be mounted and held by clipping onto the outer container. It is of course possible to hold the reflector on the outer container by gluing, or by means of an attachment system.

In another form of the reflector, the reflector is in the form of a reflective layer deposited on an outer circumference of the outer container or on an inner circumference of the outer container.

Advantageously, the lighting device further comprises an optic disposed at least partially opposite the slot of the reflector, such that the light flux coming out of said slot passes through this optic.

In one form of the optics, an optical member is mounted on the outer container, this optical member having an arc-shaped cross-section and comprising two lateral portions locked on the outer container (in particular by clipping) and a central portion forming the optic disposed at least partially opposite the slot of the reflector.

In another form of the optic, the optic is made in the form of a coating attached on the outer container or a processing carried out in the constituent material of the outer container, in particular by etching.

In a particular form, the optic is:

an optic of focusing, convergence or divergence of the light flux coming out of the slot of the reflector, or a filtering optic of the light flux coming out of the slot of the reflector of the opacifying, opalescent, sandblasted, micro lenticular or micro prismatic filtering type.

In one form, the or each lighting line comprises:

aligned LED filaments;

a first electrically conductive wire connected, on the one hand, to the cathode output terminal and, on the other hand, to the cathodes of the LED filaments; and a second electrically conductive wire connected, on the one hand, to the anode output terminal and, on the other hand, to the anodes of the LED filaments, wherein said first and second wires extend inside the outer container along and on either side of the aligned LED filaments of the lighting line.

This form is particularly advantageous to reduce the transverse bulk (or thickness or diameter) of the linear lighting device. Indeed, the two wires, in particular of the copper wire type, are particularly thin and will allow connecting in parallel all the LED filaments of the same lighting line, while having little influence on the transverse bulk of the lighting device. Furthermore, these wires will provide the mechanical cohesion of the lighting line and are too thin to interfere with the diffusion of the light over 360°.

It should further be noted that the wires may be totally bare or at least partially insulated, in particular by using enamelled wires.

In a particular variation of this form, for the or each lighting line, the LED filaments are positioned top to tale, with the cathode of a LED filament placed facing the cathode of an adjacent LED filament and with the anode of a LED filament placed facing the anode of an adjacent LED filament.

Thus, in the same lighting line, two adjacent LED filaments are oriented in opposite anode-cathode directions. This top to tale positioning is particularly handy for the wiring of the LED filaments with the two wires.

It is of course possible, alternatively, that all the LED filaments are positioned in the same anode-cathode direction in the same lighting line.

According to a feature, for the or each lighting line, the cathode of a LED filament is welded to the cathode of an adjacent LED filament and the anode of a LED filament is welded to the anode of an adjacent LED filament, and the first wire is connected to the cathodes of the LED filaments by welding tacks, and the second wire is connected to the anodes of the LED filaments by welding tacks.

The connections by welding also contribute to the miniaturization of the lighting device, while offering stability and durability.

According to another feature, for the or each lighting line, the cathode of a LED filament is linked to the cathode of an adjacent LED filament via an electrical resistance, and the anode of a LED filament is linked to the anode of an adjacent LED filament via an electrical resistance.

With several aligned LED filaments and electrically connected in parallel, it is possible to observe differences in pass voltage, of the order of the centivolt, between the LED filaments, resulting in substantial differences in temperature between the LED filaments, in particular of the order of about ten to twenty degrees.

By using resistors, such as resistors of the order of a few ohms (between 1 and 20 ohms for example), between the LED filaments and possibly between the LED filaments and the conductive wires, the resistors would absorb the differences in the pass voltage, and would balance the assembly to provide uniform temperature between the LED filaments.

Advantageously, for the or each lighting line, the first wire is held isolated from the anodes of the LED filaments by means of separating members made of electrically insulating material, and the second wire is held isolated from the cathodes of the LED filaments by means of separating members made of electrically insulating material.

These separating members will provide avoiding short circuits, especially in case of movement of the lighting device, while mechanically consolidating the lighting line, by offering a localized mechanical holding of the assembly of wire and LED filament.

In a particular variation, the separating members are constituted of adhesive or silicone tacks.

These adhesive or silicone tacks are deposited in a liquid form, then harden quickly to provide separation function, while offering a cohesion which will hold the wires in place.

In another variation, the or each lighting line comprises a longilineal support, and in one form is transparent, having on its surface at least one printed circuit which provides connection between the cathode output terminal and the cathodes of the LED filaments, and also the connection between the anode output terminal and the anodes of the LED filaments.

In this variation, a printed circuit support is used, instead of the two wires described above. This variation with support, rigid or flexible, transparent or not, allows offering a mechanically stable support for the LED filaments.

According to a possibility of the present disclosure, the lighting device comprises at least two longitudinally shifted lighting lines such that the LED filaments of a lighting line are placed in overlapping towards two LED filaments of another lighting line.

Thanks to this overlapping of at least two lighting lines, the lighting device will gain in thickness, but it will inhibit shadow areas between the LED filaments, thus offering a continuous lighting along the entire length of the lighting lines.

In one form of the outer container, the outer container is constituted of a rigid and transparent hollow tube, in particular of a circular cross-section, integrally receiving the lighting line(s).

In this form, the lighting device is fixed in a linear shaping.

In another form of the outer container, the outer container is constituted of several rigid and transparent hollow tubular segments, these tubular segments being joined end-to-end by elastically deformable bridges, where the lighting device comprises a single lighting line, and the outer container integrates as many tubular segments as the lighting line comprises of LED filaments, each tubular segment surrounding a single LED filament, each tubular segment supporting at its respective ends connection terminals between the cathodes and the anodes of the LED filaments which are surrounded by the bridges.

In this form, the lighting device may be more or less bent or curved at the elastically deformable bridge(s), thus allowing the lighting device to follow an arcuate or curved line.

Advantageously, inside each tubular segment, are arranged:

a wire called electrically conductive cathode wire which is connected, on the one hand, to the cathode of the LED filament and, on the other hand, to two connection terminals called cathode connection terminals disposed at the two opposite ends of said tubular segment; and a wire called electrically conductive anode wire which is connected, on the one hand, to the anode of the LED filament and, on the other hand, to two connection terminals called anode connection terminals disposed at the two opposite ends of said tubular segment, wherein the anode connection terminal projecting from a tubular segment is connected to the anode connection terminal projecting from an adjacent tubular segment, and the cathode connection terminal projecting from a tubular segment is connected to the cathode connection terminal projecting from an adjacent tubular segment.

According to a possibility of the present disclosure, the or each elastically deformable bridge is constituted either of a flexible seal, in particular made of silicone, partially embedded inside the open ends opposite to two adjacent tubular segments, or of a flexible sleeve mounted partially around the ends opposite to two adjacent tubular segments.

The present disclosure also provides a lighting installation comprising a chaining of at least two lighting devices in accordance with the present disclosure and joined end-to-end, in which each lighting device comprises two anode output terminals interconnected and disposed at the two respective ends of the outer container and two cathode output terminals interconnected and disposed at the two respective ends of the outer container, in which the lighting devices are electrically connected in parallel with an anode output terminal and a cathode output terminal of a lighting device connected respectively to an anode output terminal and a cathode output terminal of an adjacent lighting device.

Thus, this lighting installation comprises a chaining of several independent lighting devices and electrically connected in parallel, in other words comprises several lighting devices disposed successively by linking mechanically and end-to-end the outer containers.

In this way, it is possible to not align the lighting devices and to incline them more or less relative to each other, to allow obtaining a lighting ramp along an arcuate line.

Advantageously, one end of the outer container of at least one lighting device is joined to one end of the outer container of at least one adjacent lighting device by means of a flexible junction member which envelopes the concerned output terminals of the two said adjacent lighting devices.

The flexible joint member provides sealing, while offering the flexibility required to tolerate an inclination between two adjacent lighting devices.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 1 is a schematic side view of a LED filament according to the prior art;

FIG. 2 is a schematic side view of the LED filament of FIG. 1, with a transparent illustrated envelope to visualize an inside, a zoom of a portion of the LED filament also being illustrated, according to the prior art;

FIG. 3 is a schematic top view of the portion of the LED filament subject to a zoom in FIG. 2 according to the prior art;

FIG. 4 is a schematic view equivalent to the zoom of FIG. 2, for another type of LED filament according to the prior art;

FIG. 7 is a schematic side view of one form of a lighting device with an outer container having a hollow tube and a single lighting line in accordance with the present disclosure;

FIG. 8 is a schematic side view of another form of a lighting device with an outer container having a hollow tube and a single lighting line in accordance with the present disclosure;

FIG. 9 is schematic side view of yet another form of a lighting device with an outer container having a hollow tube and a single lighting line in accordance with the present disclosure;

FIG. 10 is a schematic side and incomplete view of another lighting device with an outer container having a hollow tube and two lighting lines, the conductive wires and the output terminals not being illustrated for sake of clarity in accordance with the present disclosure;

FIG. 11 is a schematic view of the lighting device of FIG. 10, along the cross-sectional plane A-A;

FIG. 12 is a schematic perspective view of a lighting device with an outer container having a hollow tube and integrating a reflector comprising a reflective member mounted on the hollow tube in accordance with the present disclosure;

FIG. 13 is a schematic view illustrating the positioning of the reflector towards the LED filaments in the lighting device of FIG. 12;

FIG. 14 is a schematic perspective view of a lighting device integrating a filtering coating on the circumference of the tube forming the transparent outer container in accordance with the present disclosure;

FIG. 16 is a schematic side view of another lighting device having an outer container composed of several tubular segments joined by elastically deformable bridges of a flexible sleeve type with a zoom on a portion of the lighting device in accordance with the present disclosure;

FIG. 17 is a schematic and partial front view of the lighting device of FIG. 16, after deformation at right angle of the flexible sleeve in accordance with the present disclosure;

Figure 5:
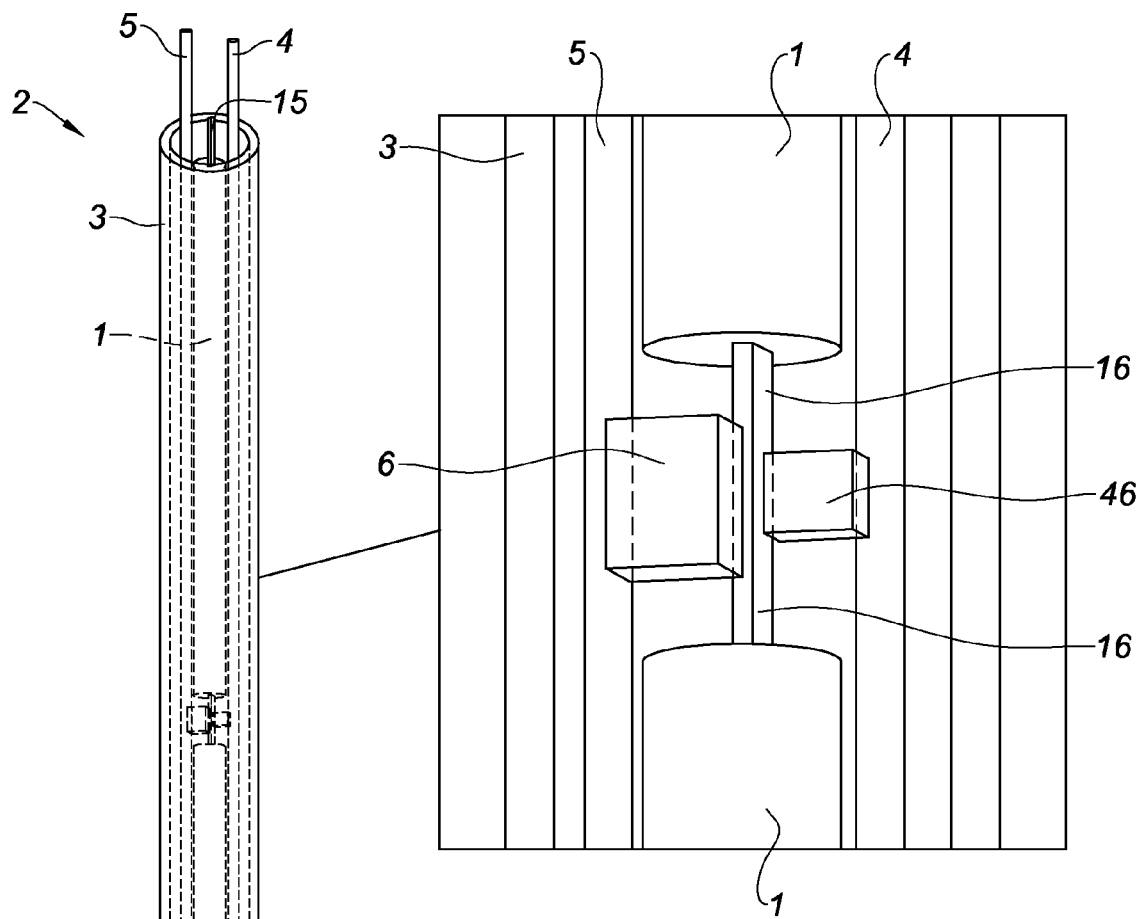
FIG. 5 is a schematic perspective view of a portion of a lighting device in accordance with the present disclosure, in which the outer container includes a hollow tube and comprises a lighting line integrating two LED filaments, also with a zoom of a portion of said lighting device in accordance with the present disclosure.
Figure 6:
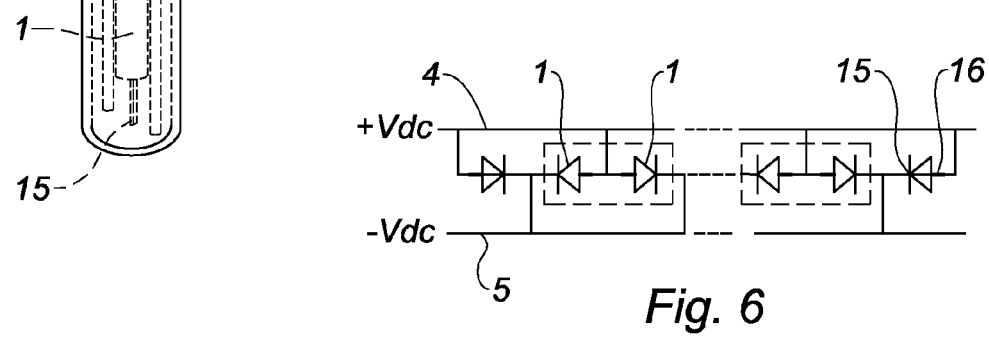
FIG. 6 is a schematic view of the wiring used for a lighting device in accordance with the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

With reference to FIGS. 5, 7, 8, 9, 10, 11, 12 and 14, a lighting device 2 in accordance with the present disclosure comprises an outer container 3 formed of a transparent tube, of circular cross-section, made of a transparent material such as glass (in particular borosilicate) or a polymer or plastic material. Thus, the tube 3 forms a hollow, rigid and longilineal part along a longitudinal axis.

The tube 3 has an outer diameter comprised between 4 and 10 millimeters, and a thickness comprised between 0.5 and 1.5 millimeters. The tube 3 has two opposite open ends 31.

The lighting device 2 also comprises at least one lighting line disposed inside the tube 3 and composed of a succession of several LED filaments 1 as previously described with reference to FIGS. 1 to 4.

For sake of miniaturization, it is advantageous that the LED filaments 1 have a transverse dimension of less than 3 millimeters, in particular in the range of 1.8 to 2.5 millimeters; the inner diameter of the tube 3 being selected depending on the transverse dimensions of the LED filaments 1.

In a lighting line, the LED filaments 1 are disposed in successive alignment along a longitudinal direction substantially parallel to the longitudinal axis of the tube 3.

In variations of FIGS. 5 to 11, for a lighting line, the LED filaments 1 are positioned top to tail, with the cathode 16 of a LED filament 1 placed facing the cathode 16 of an adjacent LED filament 1 and with the anode 15 of a LED filament 1 placed facing the anode 15 of an adjacent LED filament 1.

More specifically, within the same lighting line, the cathode 16 of a LED filament 1 is welded to the cathode 16 of an adjacent LED filament 1 and the anode 15 of a LED filament 1 is welded to the anode 15 of an adjacent LED filament 1. It is possible to provide a resistor (not illustrated) of a few ohms between the cathodes 16 of two adjacent LED filaments 1, and between the anodes 15 of two adjacent LED filaments 1.

Furthermore, the lighting device 2 comprises:

a first electrically conductive wire 4, of the bare metal wire or insulated wire type (for example enamelled wire), which is connected by welding to the cathodes 16 of the different LED filaments 1 (the zoom of FIG. 5 illustrating a welding tack 46); and a second electrically conductive wire 5, of the bare wire or insulated wire type (for example enamelled metal wire), which is connected by welding to the anodes 15 of the different LED filaments 1.

The wires 4, 5 extend inside the tube 3, along the LED filaments 1, and extend respectively on either side of the aligned LED filaments 1 of the lighting line.

The wires 4, 5 are respectively connected to at least one cathode output terminal 40 and to at least one anode output terminal 50.

Referring to FIG. 7, in one form, the lighting device 2 comprises a cathode output terminal 40 at one end 31 of the tube 3, and an anode output terminal 50 at the other end 31 of the tube 3.

Referring to FIG. 8, in another form, the lighting device 2 comprises a cathode output terminal 40 at one end 31 of the tube 3, and an anode output terminal 50 at the same end 31 of the tube 3.

Referring to FIG. 9, in yet another form, the lighting device 2 comprises a cathode output terminal 40 and an anode output terminal 50 at one end 31 of the tube 3, and also another cathode output terminal 40 and another anode output terminal 50 at the other end 31 of the tube 3.

At the anodes 15 of the LED filaments 1, the first wire 4 is held isolated from the anodes 15 of the LED filaments 1 by means of separating members 6 made of electrically insulating material, such as adhesive or silicone tacks. Similarly, at the cathodes 16 of the LED filaments 1, the second wire 5 is held isolated from the cathodes 16 of the LED filaments 1 by means of separating members 6 made of electrically insulating material, such as adhesive or silicone tacks.

Plugs 7 made of insulating material, such as plugs made of silicone or another plastic material, are placed at the ends 31 of the tube 3, and more specifically inside the tube 3. The wires 4, 5 are thus connected to the concerned output terminals 40, 50 through these plugs 7 which will contribute in holding the stability of the wires 4, 5 and the output terminals 40, 50 partially embedded in the plugs 7.

In the variations of FIGS. 5, 7, 8, 9, 12 and 14, the lighting device 2 comprises a single lighting line composed of in-line LED filaments 1.

As shown in FIG. 9, it is possible that the lighting device 2 comprises several lighting lines, in other words several series of in-line LED filaments 1, in which the LED filaments 1 of a lighting line are longitudinally shifted relative to the LED filaments of another lighting line, such that the LED filaments 1 of a lighting line are placed in overlapping relative to two LED filaments 1 of another lighting line.

As shown in FIG. 10, in the case of several lighting lines, the cathodes 16 of the LED filaments 1 are all connected (in particular by welding) to the same first wire 4 and held spaced from the second wire 5 by separating members 6, and the anodes 15 of the LED filaments 1 are all connected (in particular by welding) to the same second wire 5 and held spaced from the first wire 4 by separating members 6.

Figure 18:
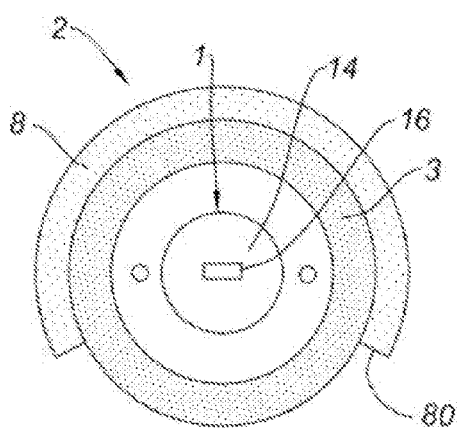
FIG. 18 is a schematic cross-sectional view of the lighting device of FIG. 12, integrating a reflector comprising a reflective member mounted on the hollow tube in accordance with the present disclosure.
Figure 19:
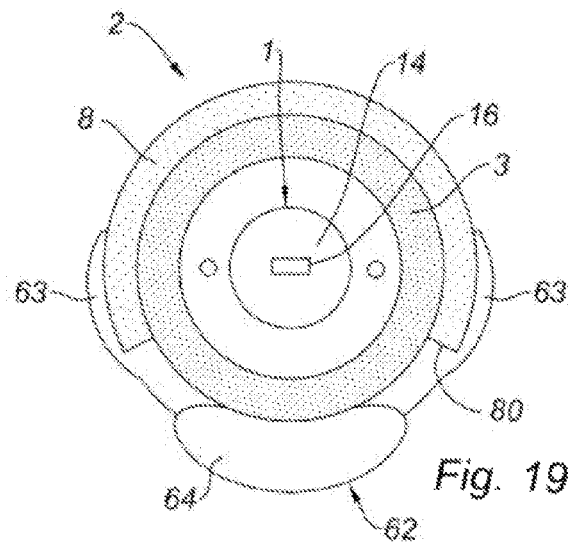
FIG. 19 is a schematic cross-sectional view of the lighting device of FIG. 18, further integrating an optical member placed on the tube.

As shown in FIG. 12, as well as in FIGS. 18 and 19, it is possible to provide one or more opaque reflector(s) 8 mounted around the tube 3, more specifically on the outer circumference (or on the outer peripheral surface) of the tube 3. As shown in FIG. 13, the or each reflector 8 is in the form of a reflective member (flexible or rigid) having an arc-shaped cross-section whose center is located substantially on a lighting line, in other words on a LED filament 1. The or each reflector 8 has a longitudinal slot 80 provided for the passage of the light emitted by the LED filaments 1.

The or each reflector 8 extends in particular over an angle sector comprised between 240 and 330°, thus offering an opening angle of the slot comprised between 30 and 120°. It is possible that a reflector 8 extends over the entire length of the tube 3, or even over at least 90% of the length of the tube 3.

The or each reflector 8 is plated on the outer circumference of the tube 3, and is held in place by clipping, allowing the sliding and the pivoting of the reflector 8 on the tube 3; other fastening means of the reflector 8 on the tube 3, in particular by gluing, being possible.

The reflector 8 includes a neutral white reflective inner coating; the features of this inner coating which may be adapted to obtain the desired colorimetry.

The positioning of the or each reflector 8 on one portion of a segment of the tube 3 allows by 360° rotation, a portion of the luminous flux to pass through its slot 8, the width of the slot 80 being sized according to the desired directivity or the light emission angle, and the length of the reflector 8 being sized according to the size of the areas to be lightened.

The LED filaments 1 are based on the interconnection of several light-emitting diodes emitting a blue light, these light-emitting diodes being covered by a gel containing fluorescent particles, in particular phosphorus particles. Thus, with such a LED filament, only one portion of the blue emission is absorbed by the phosphorus such that two emissions are superimposed at the output of the LED filament, giving the impression of a white light.

When a reflector 8 is positioned, its reflective inner coating returns the entire spectrum through the fluorescent envelope of the LED filament, which will be excited again by the "blue" rays. The output light therefore becomes less white, and so on after several reflections on the reflector 8.

In other words, the reflector 8 serves as a resonant cavity which returns several times the effective flux (blue spectrum) emitted through said reflector into the phosphorus. The phosphorus yield is therefore artificially increased by limiting the blue spectral energy coming out of the slot 80 of the reflector 8. The induced effect being a warming of the emitted light, a uniformization of the colorimetry and a very effective filtering of the blue radiation.

In a first non-illustrated variant of the reflector, the or each reflector 8 is mounted inside the tube 3, more specifically on the inner circumference (or on the inner peripheral surface) of the tube 3. The or each reflector 8 is therefore in the form of a reflective member (flexible or rigid) having an arc-shaped cross-section whose center is located substantially on a LED filament 1. The or each reflector 8 is slid inside the tube 3, and is held in place due to its arcuate shape, with the possibility of a sliding and a pivoting of the reflector 8 in the tube 3.

Figure 20:
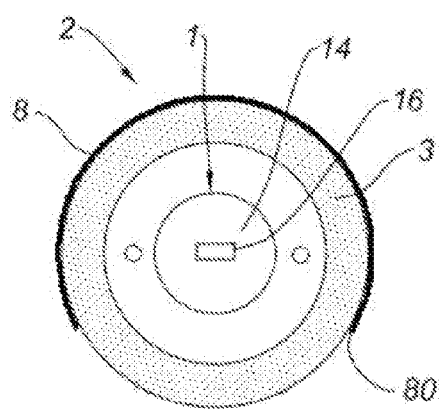
FIG. 20 is a schematic cross-sectional view of a lighting device integrating a reflector comprising a reflective layer deposited on an outer circumference of a hollow tube in accordance with the present disclosure.
Figure 21:
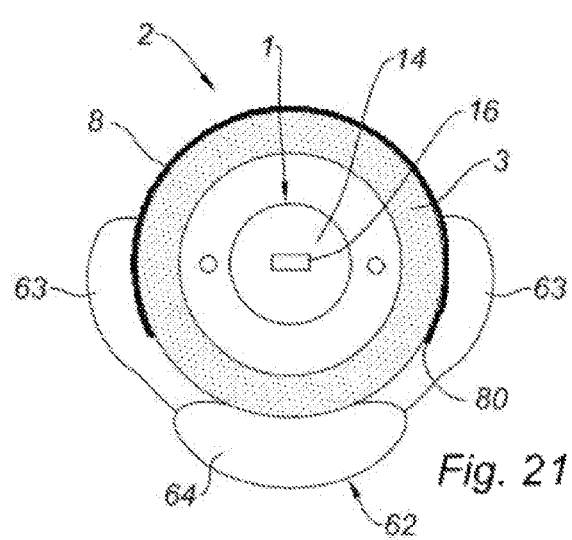
FIG. 21 is a schematic cross-sectional view of the lighting device of FIG. 20, further integrating an optical member placed on the tube in accordance with the present disclosure.

In a second variant of the reflector illustrated in FIGS. 20 and 21, the reflector 8 is made in the form of a reflective layer 30 deposited on the outer circumference (or on the outer peripheral surface) of the tube 3, and more specifically deposited on an arc-shaped cross-section of the tube 3 of predefined length. The reflector 8 formed of such an outer reflective layer accordingly has a longitudinal slot 80 provided for the passage of the light emitted by the LED filaments 1, and extends in particular over an angle sector comprised between 240 and 330°, thus offering an opening angle of the slot 80 comprised between 30 and 120°. This outer reflective layer may, for example, be deposited by painting or by electro-evaporation.

Figure 22:
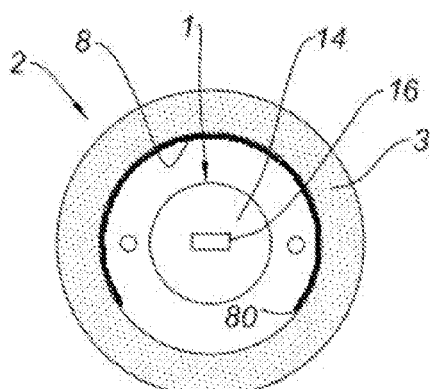
FIG. 22 is a schematic cross-sectional view of a lighting device integrating a reflector comprising a reflective layer deposited on the inner circumference of the hollow tube in accordance with the present disclosure.
Figure 23:
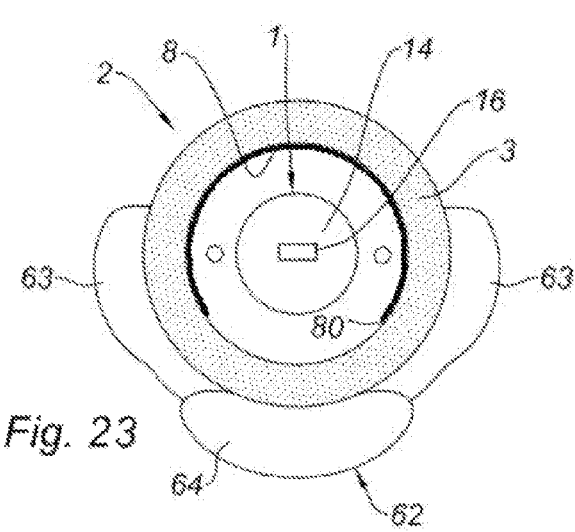
FIG. 23 is a schematic cross-sectional view of the lighting device of FIG. 20, further integrating an optical member placed on the tube in accordance with the present disclosure.

In a third variant of the reflector illustrated in FIGS. 22 and 23, the reflector 8 is made in the form of a reflective layer 5 deposited on the inner circumference (or on the inner peripheral surface) of the tube 3, and more specifically deposited on an arc-shaped cross-section of the tube 3 of predefined length. The reflector 8 formed by such an inner reflective layer thus has a longitudinal slot 80 provided for the passage of the light emitted by the LED filaments 1, and extends particularly over an angle sector comprised between 240 and 330°, accordingly offering an opening angle of the slot 80 comprised between 30 and 120°. This inner reflective layer may be, for example, deposited by painting or by electro-evaporation.

As shown in FIGS. 19, 21 and 23, it is possible to mount an optical member 62 on the tube 3 which serves, for example, to converge or diverge the light flux coming out of the slot 80 of a reflector 8. This optical member 62 has an arc-shaped cross-section and comprises two lateral portions 63 which are clipped on the tube 8, possibly over the reflector 8 when the reflector 8 is arranged on the outer circumference of the tube 3, and a central portion 64 forming an optic positioned opposite to the slot 80 of the reflector 8. The lateral portions 63 may be made of a frosted translucent material.

The central portion 64 may form a lens-type optic (convergent or divergent) and be thus made of a transparent material and have a shape adapted for a convergence or a divergence of the light flux coming out of the slot 80 of the reflector 8.

Alternatively, the central portion 64 may form an optic of the opalescent or opacifying member type, made of a translucent material which gives the light a milky aspect or tint, with iridescent reflections reminding those of the opal.

Instead of the optical member 62 attached to the tube 3, it is possible to engrave directly an optic (for example an opacifying, focusing, convergence or divergence optic) on the outer or inner circumference of the tube 3, on a strip of the tube 3 in correspondence with the slot 80 of the reflector 8, such that the light flux coming out of the slot 80 of the reflector 8 passes through this optic.

As shown in FIG. 14, it is also possible to provide a filtering coating 9 positioned by gluing on the outer circumference of the tube 3 to improve the spectral homogeneity of the flux. The filtering coating 9 is for example of the type micro-lenticular film, micro-prism film or Frost film. With such a filtering coating 9, the distribution of light is indeed a little more homogeneous, on the contrary the light efficiency tends to slightly decrease. In the presence of a reflector 8, such a coating 9 may be provided only on a strip of the tube 3 in correspondence with the slot 80 of the reflector 8, such that the light flux coming out of the slot 80 of the reflector 8 passes through this filtering coating 9.

Alternatively, it is possible to use for the tube 3 an opacified, opalescent or sandblasted glass.

Figure 15:
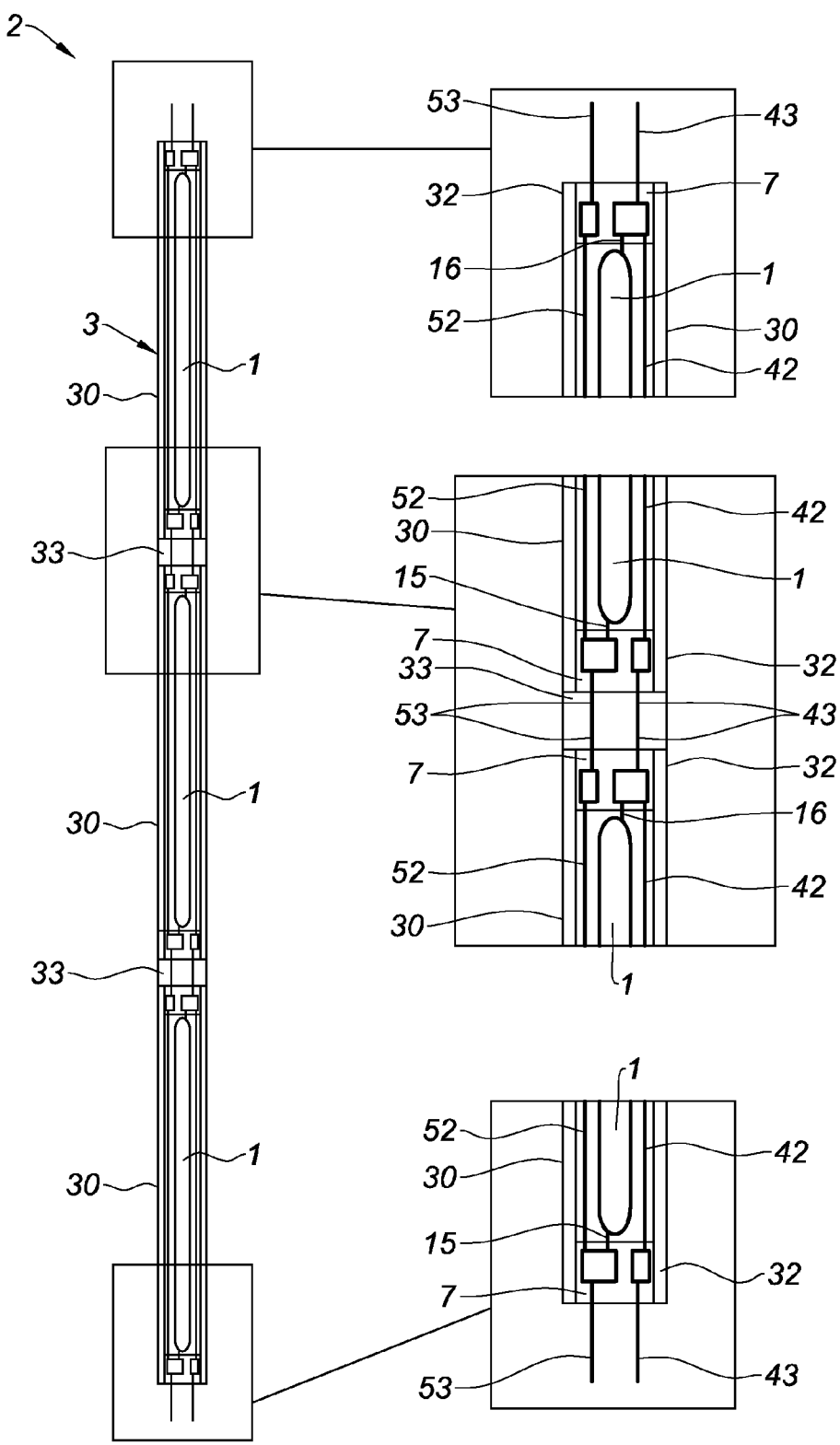
FIG. 15 is a schematic side view of another lighting device having an outer container composed of several tubular segments joined by elastically deformable bridges of a flexible seal type with three zooms on different portions of the lighting device in accordance with the present disclosure.

With reference to FIGS. 15 to 17, a lighting device 2 in accordance with the present disclosure may also comprise an outer container 3 which forms a hollow part comprising several hollow, rigid and transparent tubular segments 30, particularly of circular cross-section, these tubular segments 30 being joined end-to-end by elastically deformable bridges 33 which allow the inclination between two adjacent tubular segments 30.

The tubular segments 30 are made of a rigid and transparent material such as glass (in particular made of borosilicate) or a polymer or plastic material. In one form, the tubular segments 30 are identical in their shapes and sizes.

In this form with several tubular segments 30:

each tubular segment 30 has, for example, an outer diameter comprised between 4 and 10 millimeters, and a thickness comprised between 0.5 and 1.5 millimeters, each tubular segment 30 having two opposite open ends 32;

the lighting device 2 also comprises a single lighting line arranged inside the successive tubular segments 3, the lighting line being composed of a succession of several LED filaments 1 as previously described with reference to FIGS. 1 to 4;

the outer container 3 integrates as many tubular segments 30 as the lighting line comprises LED filaments 1, each tubular segment 30 surrounding a single LED filament 1.

More specifically, inside each tubular segment 30, are arranged:

a wire called electrically conductive cathode wire 42 which is connected, on the one hand, to the cathode 16 of the LED filament 1 and, on the other hand, to two connection terminals called cathode connection terminals 43 arranged at the two opposite ends 32 of said tubular segment 30;

a wire called electrically conductive anode wire 52 which is connected, on the one hand, to the anode 15 of the LED filament 41 and, on the other hand, to two connection terminals called anode connection terminals 53 arranged at the two opposite ends 32 of said tubular segment; and plugs 7 made of insulating material, such as plugs made of silicone or of another plastic material, which are placed at the ends 32 of the tubular segment 30, and more specifically inside the tubular segment 30.

The anode connection terminal 53 projecting from a tubular segment 30 is connected to the anode connection terminal 53 projecting from an adjacent tubular segment 30, either by welding or by means of a flexible electrical wire allowing the inclination between two adjacent tubular segments 30.

Similarly, the cathode connection terminal 43 projecting from a tubular segment 30 is connected to the cathode connection terminal 43 projecting from an adjacent tubular segment 30, either by welding or by means of a flexible electrical wire allowing the inclination between two adjacent tubular segments 30.

Of course, the connection terminals 43, 53 at the ends of the outer container 3 form output terminals of the lighting device 2.

Furthermore, the plugs 7 will contribute in holding the stability of the wires 42, 52 and of the connection terminals 43, 53 which are partially embedded in the plugs 7.

Referring to FIG. 15, in one variation, each elastically deformable bridge 33 is constituted of a flexible seal, in particular made of an elastomer material such as silicone, partially embedded inside the open ends 32 opposite to two adjacent tubular segments 30. The flexible seal 33 holds a longitudinal isolation between the ends 32 opposite to two adjacent tubular segments 30. The flexible seal 33 is, for example, integral with the plugs 7. The filling with the elastomer material may be performed by injection into a mold which regains the same diameter as the open end 32; the advantage of such a filling being that it provides excellent mechanical bonding of the assembly because the elastomer material adheres onto the sides of the ends 32, while providing constant positioning of the connection terminals 43, 53.

Referring to FIGS. 16 and 17, in other variations, each elastically deformable bridge 33 is constituted of a flexible sleeve, in particular of an elastomer material such as silicone, partially mounted around the ends 32 facing two adjacent tubular segments 30.

As shown in FIG. 17, it is possible to incline a tubular segment 30 relative to an adjacent tubular section 30 at a non-zero angle, such as for example a right angle, thanks to the deformability of the elastically deformable bridge 33 and the cathode connection terminals 43 which form foldable tabs.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:
1. A lighting device comprising:
  a plurality of LED filaments disposed inside an outer container that is at least partially transparent and connected to anode and cathode output terminals disposed outside the outer container, each LED filament comprising:
    a substrate that is longilineal;
    a plurality of light-emitting diodes regularly distributed in line on the substrate, said light-emitting diodes connected successively in sequence and in series;
    an envelope overmolded around the light-emitting diodes and the substrate;
    two metal electrodes forming respectively the anode and the cathode of the LED filament projecting from said envelope, said two metal electrodes fastened to two opposite ends of the substrate and electrically connected to a first and last light-emitting diodes placed on the substrate; and
  at least one opaque reflector having a reflective inner surface, the at least one opaque reflector disposed on a circumference of the outer container and having a longitudinal slot for passage of light emitted by the plurality of LED filaments,
  wherein said outer container forms a hollow and longilineal part provided with two opposite ends, and
  wherein the plurality of LED filaments are distributed along at least one lighting line, the at least one lighting line comprising a plurality of LED filaments disposed in successive alignment and connected in parallel such that their anodes are connected to the anode output terminal and their cathodes are connected to the cathode output terminal.

2. The lighting device according to claim 1, wherein the at least one lighting line comprises:
  aligned LED filaments;
  a first electrically conductive wire connected to the cathode output terminal and to the cathodes of the LED filaments; and
  a second electrically conductive wire connected to the anode output terminal and to the anodes of the LED filaments,
  wherein said first and second electrically conductive wires extend inside the outer container along and on either side of the aligned LED filaments of the lighting line.

3. The lighting device according to claim 2, wherein the LED filaments are positioned top to tail of the lighting line, wherein the cathode of a LED filament faces a cathode of an adjacent LED filament and the anode of a LED filament faces the anode of an adjacent LED filament.

4. The lighting device according to claim 3, wherein the cathode of a LED filament is welded to the cathode of an adjacent LED filament and the anode of a LED filament is welded to the anode of an adjacent LED filament, wherein the first electrically conductive wire is connected to the cathodes of the LED filaments by weld tacks, and the second electrically conductive wire is connected to the anodes of the LED filaments by weld tacks.

5. The lighting device according to claim 3, wherein the cathode of a LED filament is linked to the cathode of an adjacent LED filament via an electrical resistance, and the anode of a LED filament is linked to the anode of an adjacent LED filament via an electrical resistance.

6. The lighting device according to claim 2, wherein the first electrically conductive wire is held isolated from the anodes of the LED filaments by separating members made of electrically insulating material, and the second electrically conductive wire is held isolated from the cathodes of the LED filaments by separating members made of electrically insulating material.

7. The lighting device according to claim 6, wherein the separating members are adhesive or silicone tacks.

8. The lighting device according to claim 1 further comprising an optic disposed at least partially opposite to the longitudinal slot of the at least one opaque reflector so that a light flux coming out of said longitudinal slot passes through the optic.

9. The lighting device according to claim 8 further comprising an optical member mounted on the outer container, said optical member having an arc-shaped cross-section and comprising two lateral portions locked on the outer container and a central portion forming the optic disposed at least partially opposite to the longitudinal slot of the reflector.

10. The lighting device according to claim 8, wherein the optic is at least one of a coating attached on the outer container or a constituent material of the outer container.

11. The lighting device according to claim 8, wherein the optic is at least one of a focusing, convergence, divergence, or a filtering optic of the light flux coming out of the longitudinal slot of the reflector, wherein the filtering optic is at least one of opacifying, opalescent, sandblasted, microlenticular or micro-prismatic filtering type.

12. The lighting device according to claim 1, wherein each opaque reflector has an arc-shaped cross-section and a center of the opaque reflector is substantially located on the lighting line, such that it forms, in a lighting situation, a resonant cavity that returns multiple times a lighting flux into the envelopes of at least one LED filament.

13. The lighting device according to claim 1, wherein the at least one opaque reflector is a reflective member that is mounted around the outer circumference of the outer container or mounted on an inner circumference of the outer container.

14. The lighting device according to claim 1, wherein the at least one opaque reflector is a reflective layer deposited on at least one of an outer circumference of the outer container or on an inner circumference of the outer container.

15. The lighting device according to claim 1, wherein the at least one opaque reflector extends over an angle sector at least greater than 200°.

16. The lighting device according to claim 1, wherein each lighting line comprises a longilineal support having at least one printed circuit on a surface of the longilineal support that provides a connection between the cathode output terminal and the cathodes of the LED filaments and a connection between the anode output terminal and the anodes of the LED filaments.

17. The lighting device according to claim 1 further comprising at least two longitudinally shifted lighting lines such that the LED filaments of a lighting line are placed overlapping towards two LED filaments of another lighting line.

18. The lighting device according to claim 1, wherein the outer container is a rigid and transparent hollow tube integrally receiving the at least one lighting line.

19. The lighting device according to claim 1, wherein the outer container is a plurality of hollow tubular segments that are rigid and transparent, the plurality of hollow tubular segments joined end-to-end by elastically deformable bridges,
wherein the lighting device further comprises a single lighting line, and the outer container integrates as many hollow tubular segments as the lighting line comprises of LED filaments,
each hollow tubular segment surrounding a single LED filament, each hollow tubular segment supporting at its respective ends connection terminals between the cathodes and the anodes of the LED filaments which are surrounded by the elastically deformable bridges.

20. The lighting device according to claim 19, wherein an inside of each hollow tubular segment comprises:
an electrically conductive cathode wire that is connected to the cathode of the LED filament and connected to two cathode connection terminals disposed at two opposite ends of said hollow tubular segment; and
an electrically conductive anode wire which is connected to at least one of the anode of the LED filament and to two anode connection terminals disposed at two opposite ends of said hollow tubular segment;
wherein the anode connection terminal projecting from a hollow tubular segment is connected to the anode connection terminal projecting from an adjacent hollow tubular segment, and the cathode connection terminal projecting from a hollow tubular segment is connected to the cathode connection terminal projecting from an adjacent hollow tubular segment.

21. The lighting device according to claim 19, wherein each elastically deformable bridge is at least one of a flexible seal partially embedded inside the open ends opposite to two adjacent hollow tubular segments or of a flexible sleeve mounted partially around the ends opposite to two adjacent hollow tubular segments.

22. A lighting installation comprising a chaining of at least two lighting devices in accordance with claim 1 and joined end-to-end, wherein each lighting device comprises two anode output terminals interconnected and disposed at two respective ends of the outer container and two cathode output terminals interconnected and disposed at two respective ends of the outer container, wherein the lighting devices are electrically connected in parallel with an anode output terminal and a cathode output terminal of a lighting device connected to an anode output terminal and a cathode output terminal of an adjacent lighting device.

23. The lighting installation according to claim 22, wherein one end of one outer container of at least one lighting device is joined to one end of an outer container of at least one adjacent lighting device by a flexible junction member that envelopes the output terminals of the two adjacent lighting devices.

* * * * *